(12) United States Patent
Adachi et al.

(10) Patent No.: US 10,193,332 B2
(45) Date of Patent: Jan. 29, 2019

(54) ESD PROTECTION DEVICE

(71) Applicant: Murata Manufacturing Co., Ltd., Kyoto (JP)

(72) Inventors: Jun Adachi, Kyoto (JP); Katsumi Yasunaka, Kyoto (JP); Takahiro Sumi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 541 days.

(21) Appl. No.: 14/930,833

(22) Filed: Nov. 3, 2015

(65) Prior Publication Data

US 2016/0056627 A1 Feb. 25, 2016

Related U.S. Application Data

(63) Continuation of application No. PCT/JP2014/059616, filed on Apr. 1, 2014.

(30) Foreign Application Priority Data

May 23, 2013 (JP) .................. 2013-109128

(51) Int. Cl.
*H02H 9/00* (2006.01)
*H02H 9/04* (2006.01)
(Continued)

(52) U.S. Cl.
CPC ......... *H02H 9/04* (2013.01); *H01L 23/49822* (2013.01); *H01L 23/49838* (2013.01);
(Continued)

(58) Field of Classification Search
CPC ...................................................... H02H 9/04
See application file for complete search history.

(56) References Cited

U.S. PATENT DOCUMENTS 8,238,069 B2 * 8/2012 Adachi ..................... H01T 1/20
361/212
8,658,245 B2 * 2/2014 Hall ....................... H05K 1/184
427/240

(Continued)

FOREIGN PATENT DOCUMENTS

| JP | H08-83671 A | 3/1996 |
| JP | H11-204232 A | 7/1999 |

(Continued)

OTHER PUBLICATIONS

International Search Report issued in Application No. PCT/JP2014/059616 dated May 27, 2014.

(Continued)

*Primary Examiner* — Stephen W Jackson
(74) *Attorney, Agent, or Firm* — Pearne & Gordon LLP (57) ABSTRACT

There is provided an ESD protection device that can have an advantageously low discharge inception voltage. An ESD protection device having a substrate, first and second discharge electrodes provided somewhere on the substrate with their respective distal ends facing each other with a gap therebetween, and a high-dielectric-constant layer having a relative dielectric constant higher than that of the substrate.

14 Claims, 8 Drawing Sheets

(51) Int. Cl.
  *H01T 1/22* (2006.01)
  *H01T 2/02* (2006.01)
  *H01T 4/10* (2006.01)
  *H01L 23/498* (2006.01)
  *H01L 23/60* (2006.01)

(52) U.S. Cl.
  CPC ............... *H01L 23/60* (2013.01); *H01T 1/22* (2013.01); *H01T 2/02* (2013.01); *H01T 4/10* (2013.01); *H01L 2924/0002* (2013.01)

(56) References Cited

U.S. PATENT DOCUMENTS

| | | | |
|---|---|---|---|
| 8,885,324 B2 * | 11/2014 | Bultitude | H01G 4/30 361/279 |
| 2010/0309595 A1 | 12/2010 | Adachi | |
| 2012/0162838 A1 | 6/2012 | Sawada | |
| 2013/0222956 A1 | 8/2013 | Hiehata | |

FOREIGN PATENT DOCUMENTS

| | | | |
|---|---|---|---|
| JP | 2001-043954 | † | 2/2001 |
| JP | 2002-043021 A | | 2/2002 |
| JP | 2010-015773 | † | 1/2010 |
| JP | 2010-146779 | † | 7/2010 |
| JP | 2010-146779 A | | 7/2010 |
| JP | 2010-153719 A | | 7/2010 |
| WO | 20091098944 A1 | | 8/2009 |
| WO | 20111040435 A1 | | 4/2011 |
| WO | 20121043534 A1 | | 4/2012 |

OTHER PUBLICATIONS

Translation of Written Opinion issued in Application No. PCT/JP2014/059616 dated May 27, 2014.

* cited by examiner
† cited by third party

ESD PROTECTION DEVICE

BACKGROUND

Technical Field

The present disclosure relates to an ESD protection device for protecting an electronic circuit from static electricity, in particular, an ESD protection device having opposite discharge electrodes with a gap therebetween.

Patent Document 1 below discloses an ESD protection device having first and second discharge electrodes in a ceramic multilayer substrate. The device also includes an assisting electrode coupled with the first and second discharge electrodes. The assisting electrode has been formed through the dispersion of a conductive material coated with a nonconductive inorganic material.

Patent Document 2 below discloses a chip-type surge absorber including opposite discharge electrodes located on an insulating substrate with a discharge gap therebetween. Between the discharge electrodes and the insulating substrate, there is a dielectric layer having a relative dielectric constant larger than that of the insulating substrate. The publication mentions that forming the insulating substrate itself from this dielectric layer makes the surge absorber difficult to use with a high-frequency circuit because of an increased electrostatic capacity.

Patent Document 1: International Patent Publication No. WO 2009/098944

Patent Document 2: Japanese Unexamined Patent Application Publication No. 2002-43021

BRIEF SUMMARY

The assisting electrode of the ESD protection device described in Patent Document 1 reduces its discharge inception voltage, but not to a sufficient extent.

As for the chip-type surge absorber described in Patent Document 2, what reduces its discharge inception voltage is the aforementioned dielectric layer. According to the disclosure in Patent Document 2, the dielectric layer is confined to the outside of the discharge gap so that the electrostatic capacity is prevented from increasing. The dielectric layer therefore extends only under the discharge electrode placed on the insulating substrate. This prevents the full use of surface discharge, one of the forms of discharges such as aerial discharge and surface discharge. It is therefore difficult to make its discharge inception voltage sufficiently low.

The present disclosure provides an ESD protection device that can have an advantageously low discharge inception voltage.

An ESD protection device according to the present disclosure includes a substrate, first and second discharge electrodes provided somewhere of the substrate and facing each other with a gap therebetween, and a high-dielectric-constant layer having a relative dielectric constant higher than that of the substrate. The high-dielectric-constant, directly or indirectly, couples the first discharge electrode and the second discharge electrode.

An ESD protection device according to the present disclosure can further includes a discharge-assisting electrode for promoting discharge between the first and second discharge electrodes. The discharge-assisting electrode couples the first discharge electrode and the second discharge electrode.

In a particular aspect of an ESD protection device according to the present disclosure, the discharge-assisting electrode contains conductive particles coated with a nonconductive material.

In another particular aspect of an ESD protection device according to the present disclosure, the high-dielectric-constant layer is on the discharge-assisting electrode.

In an ESD protection device according to the present disclosure, the high-dielectric-constant layer can extend at least above or beneath the gap section.

In an ESD protection device according to the present disclosure, there can be located in the gap a section having a relative dielectric constant lower than that of the substrate. The section having a relative dielectric constant lower than that of the substrate may be a cavity. The section having a relative dielectric constant lower than that of the substrate may be made of a material having a relative dielectric constant lower than that of the substrate. The material having a relative dielectric constant lower than that of the substrate can be a plastic (resin).

An ESD protection device according to the present disclosure may further include a back electrode overlapping with the gap between the first and second discharge electrodes with part of the substrate therebetween.

There may be first and second outer electrodes somewhere of the substrate and electrically coupled with the first and second discharge electrodes, respectively, and the back electrode is electrically coupled with at least one of the first and second outer electrodes. The back electrode may, however, be a floating electrode.

In an ESD protection device according to the present disclosure, the back electrode may contain a metal and a material having a dielectric constant higher than that of the substrate.

In an ESD protection device according to the present disclosure, the first and second discharge electrodes may be located on the outer surface of the substrate.

In an ESD protection device according to the present disclosure, the respective distal ends of the first and second discharge electrodes may be in the substrate with the gap in the substrate.

An ESD protection device according to the present disclosure, in which a high-dielectric-constant layer having a relative dielectric constant higher than that of the substrate is, directly or indirectly, coupled with the first and second discharge electrodes, can have a low discharge inception voltage. This enables the device to effectively protect an electronic circuit or similar from static electricity.

DETAILED DESCRIPTION

The following describes some specific embodiments of the present disclosure with reference to drawings to make the present disclosure clearly understood.

Figure 1:
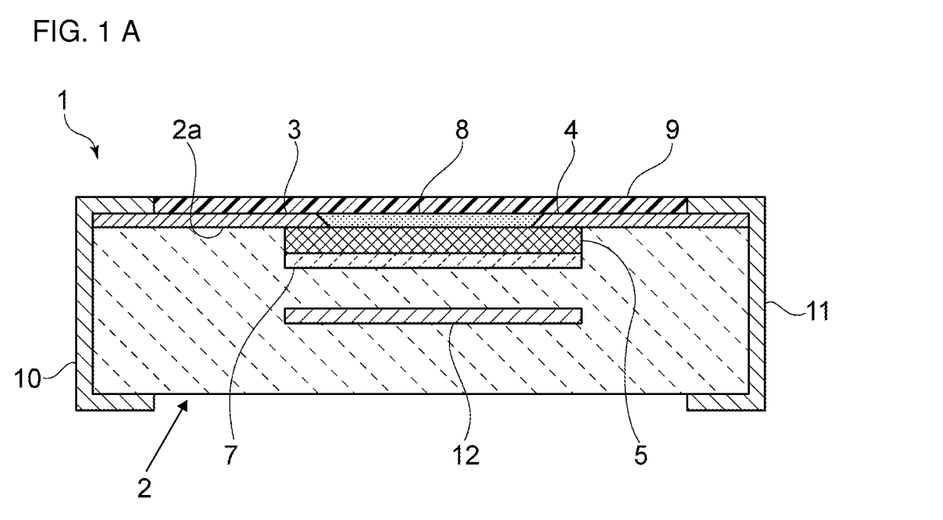
FIGS. 1A and 1B are a cross-sectional front view of an ESD protection device according to Embodiment 1 of the present disclosure and a partial cutaway enlarged cross-sectional front view of its main part.

FIGS. 1A and 1B are a cross-sectional front view of an ESD protection device according to Embodiment 1 of the present disclosure and a partial cutaway cross-sectional front view of its main part.

The ESD protection device 1 has a substrate 2. The substrate 2 is made of an appropriate insulating material. The substrate 2 in this embodiment is a ceramic multilayer substrate made of BAS, a material containing Ba, Al, and Si as its main components. Low-temperature co-fired ceramics (LTCC) such as glass ceramics can also be used. Furthermore, high-temperature co-fired ceramics (HTCC) such as aluminum nitride and alumina may be used. Magnetic ceramics such as ferrite are also usable. When made of the aforementioned BAS, for example, the substrate 2 has a relative dielectric constant of approximately 6.

The substrate 2 may be made of a non-ceramic insulating material such as plastics (resin). There are a first discharge electrode 3 and a second discharge electrode 4 on the top surface 2a of the substrate 2. Furthermore, there is a discharge-assisting electrode 5 on the bottom surface of the first and second discharge electrodes 3 and 4 in such a manner that it couples the respective distal ends of the first and second discharge electrodes 3 and 4.

Figure 2:
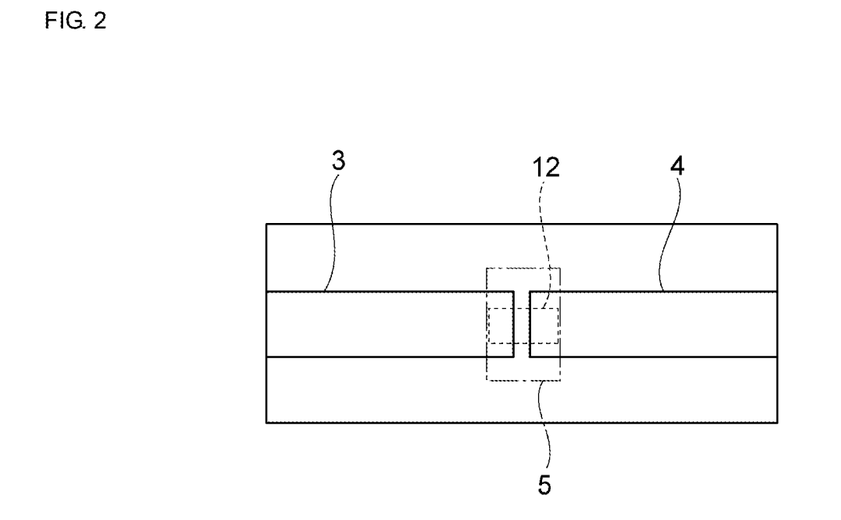
FIG. 2 is a schematic plan view for describing the relative positions of first and second discharge electrodes, a discharge-assisting electrode, and a back electrode in an ESD protection device according to Embodiment 1 of the present disclosure.

The discharge-assisting electrode 5 makes the first discharge electrode 3 and the second discharge electrode 4 coupled on the top surface 2a of the substrate 2. As illustrated in FIG. 2, the discharge-assisting electrode 5 is located in a region including a gap region, a region where the respective distal ends of the first and second discharge electrodes 3 and 4 face each other.

The discharge-assisting electrode 5 has been formed through the dispersion of conductive particles 6 coated with a nonconductive material on the top surface 2a of the substrate 2. To be more specific, the discharge-assisting electrode 5 is formed through the application and firing of a paste containing such conductive particles. This makes the conductive particles 6 coated with a nonconductive material in the paste diffuse from the top surface 2a of the substrate 2 into the surface layer of the substrate 2, forming the discharge-assisting electrode.

The discharge-assisting electrode 5 promotes discharge between the distal end of the first discharge electrode 3 and that of the second discharge electrode 4.

The material of which the conductive particles coated with a nonconductive material are made is not necessarily limited. Examples of nonconductive materials include insulating ceramics such as alumina, as well as glass. The material of which the conductive particles are made is not necessarily limited either, and can be a metal or any other appropriate material. Such a metal may be copper or a copper-based alloy, an alloy containing copper as its main component. Other metals, such as silver, aluminum, molybdenum, and tungsten, and alloys based on metals other than copper may also be used.

Besides the conductive particles coated with a nonconductive material, the discharge-assisting electrode 5 may contain semiconductor ceramic particles. Such semiconductor ceramic particles can be particles made from SiC, TiC, or similar.

In this embodiment, there is a high-dielectric-constant layer 7 beneath the discharge-assisting electrode 5. The high-dielectric-constant layer 7 is a layer made of a material having a relative dielectric constant higher than that of the substrate 2. This material having a high relative dielectric constant may have a relative dielectric constant at least double that of the material of which the substrate 2 is made, and the relative dielectric constant can be 10000 or less. Making the relative dielectric constant in this range leads to a sufficiently large difference between the relative dielectric constant of the substrate 2 and that of the high-dielectric-constant layer 7. This facilitates the development of the electric field focusing and charging effects described below, resulting in a more advantageously low discharge inception voltage.

The high-dielectric-constant layer 7 can be made of any material having a relative dielectric constant higher than that of the substrate 2. Suitable materials for the high-dielectric-constant layer 7 include ceramic materials having a relative dielectric constant higher than that of the substrate 2. Examples of such ceramic materials include barium titanate, calcium zirconate, calcium titanate, strontium titanate, and magnesium titanate. The relative dielectric constants of materials, such as barium titanate, calcium zirconate, calcium titanate, strontium titanate, and magnesium titanate are approximately 30 or more and 10000 or less.

The high-dielectric-constant layer 7, directly or indirectly, couples the distal end of the first discharge electrode 3 and that of the second discharge electrode 4. In this embodiment, the high-dielectric-constant layer 7 is on the discharge-assisting electrode 5. The high-dielectric-constant layer 7 therefore indirectly couples the distal end of the first discharge electrode and that of the second discharge electrode. It is also possible that the high-dielectric-constant layer 7 couples the distal end of the first discharge electrode 3 and that of the second discharge electrode 4 directly, with no intervening discharge-assisting electrode 5. The high-dielectric-constant layer 7 in this embodiment is in the same shape as the discharge-assisting electrode and located right under the discharge-assisting electrode 5. In plan view, therefore, the high-dielectric-constant layer 7 is in the same position as the discharge-assisting electrode 5 illustrated in FIG. 2.

As illustrated in FIGS. 1A and 1B, there is a plastic (resin) layer 8 in the gap section, a section where the respective distal ends of the first and second discharge electrodes 3 and 4 face each other. The plastic (resin) layer 8 is made of a synthetic plastic (resin), and its relative dielectric constant is lower than that of the substrate 2. Examples of plastics (resins) of which such a plastic (resin) layer 8 is made include silicone resin.

In this embodiment, the plastic (resin) layer 8 is formed after the formation of the discharge electrodes 3 and 4. The plastic (resin) layer 8 is therefore formed by applying the plastic (resin) of which the plastic (resin) layer 8 is made to fill the gap. The top surface of the plastic (resin) layer 8 in this embodiment is therefore flush with the top surfaces of the first and second discharge electrodes 3 and 4.

Furthermore, there is a second plastic (resin) layer 9 covering the first and second discharge electrodes 3 and 4 and the plastic (resin) layer 8. The second plastic (resin) layer 9 is made of a plastic (resin) having a relative dielectric constant higher than that of the first plastic (resin) layer 8. Examples of such plastics (resins) include epoxy resin. Note that in this embodiment, the first and second plastic (resin) layers 8 and 9 are optional. For example, the first plastic (resin) layer 8 may be replaced with a cavity. The first and second plastic (resin) layers 8 and 9 may be made of the same material.

As illustrated in FIG. 1A, there are first and second outer electrodes 10 and 11 electrically coupled with the first and second discharge electrodes 3 and 4. The first and second outer electrodes 10 and 11 are electrically coupled with the first and second discharge electrodes 3 and 4, respectively, on the top surface of the substrate 2. The first and second outer electrodes 10 and 11 extend along the side surfaces of the substrate 2 and reach the bottom surface. The first and second outer electrodes 10 and 11 are made of an appropriate metal or alloy.

In the substrate 2, there is a back electrode 12. As illustrated in FIG. 2, the back electrode 12 in plan view overlaps with the gap section, a section where the first and second discharge electrodes 3 and 4 face each other.

The back electrode 12 faces the first and second discharge electrodes 3 and 4 and the high-dielectric-constant layer 7 with some layers of the substrate 2 therebetween. The substrate 2 in this embodiment is a ceramic multilayer substrate. The back electrode 12 can therefore be formed during the process of producing the substrate 2.

The back electrode 12 can be made of an appropriate conductive material. The back electrode 12 can be a metal-based electrode. Such a metallic material can be a metal similar to that used in the first and second discharge electrodes 3 and 4.

The ESD protection device 1 has a discharge-assisting electrode 5 and a high-dielectric-constant layer 7 on the discharge-assisting electrode 5 which both couple the respective distal ends of the first and second discharge electrodes 3 and 4. This makes the discharge inception voltage advantageously low. This is because the first and second discharge electrodes 3 and 4 are adjoined by materials having a dielectric constant different from theirs. To be more specific, there are some materials having a dielectric constant different from that of the first and second discharge electrodes 3 and 4, such as the plastic (resin) layer 8, the discharge-assisting electrode 5, and the high-dielectric-constant layer 7, near the surfaces of the first and second discharge electrodes 3 and 4. As a result, electric field focusing is promoted on the respective surfaces, in particular, distal ends, of the first and second discharge electrodes 3 and 4. The electric field focusing facilitates the movement of electrons as the trigger for discharge. This appears to result in the low discharge inception voltage.

In this embodiment, furthermore, the high-dielectric-constant layer 7 located beneath the discharge-assisting electrode 5 contributes to the advantageously low discharge inception voltage. This is because the electric field focusing promoted by the presence of the high-dielectric-constant layer 7 facilitates surface discharge occurring on the discharge-assisting electrode 5.

Furthermore, an accompanying increase in the electrostatic capacity between the opposite first and second discharge electrodes 3 and 4 seemingly enhances the charge effect during discharge. This enhanced charge effect seems to be another contributor to the low discharge inception voltage. The inventors have ascertained that ESD protection devices according to the present disclosure can be used even with high-frequency circuits because the increase in electrostatic capacity is not excessive.

Moreover, the presence of the back electrode 12 further promotes electric field focusing, thereby making the discharge inception voltage even lower.

In the present disclosure, however, the discharge-assisting electrode 5 and the back electrode 12 are optional. For example, the discharge-assisting electrode 5 may be replaced with a porous layer in which a substance such as a voltage-nonlinear material, metal, or semiconductor is dispersed.

The back electrode 12 can be electrically coupled with the first outer electrode 10 or the second outer electrode 11. This leads to an electrostatic capacity being formed between the discharge electrode 3 or discharge electrode 4 and the back electrode 12. The formed electrostatic capacity is increased by the presence of the high-dielectric-constant layer 7. The charge effect during discharge is therefore further enhanced, and the discharge inception voltage becomes even lower. The inventors have ascertained that even in this case, the increase in electrostatic capacity is not excessive, so that the device can be used with a high-frequency circuit.

Furthermore, the above arrangement allows discharge-derived heat to be rapidly dissipated from the back electrode 12 to the outer electrode 10 or outer electrode 11 electrically coupled with the back electrode 12. This reduces thermal damage to the ESD protection device 1.

When the ESD protection device 1 is produced, the substrate 2 can be formed using a method for producing a ceramic multilayer substrate. The discharge-assisting electrode 5, the high-dielectric-constant layer 7, and the first and second discharge electrodes 3 and 4 can also be easily formed. The production process is therefore not complicated.

Figure 3A:
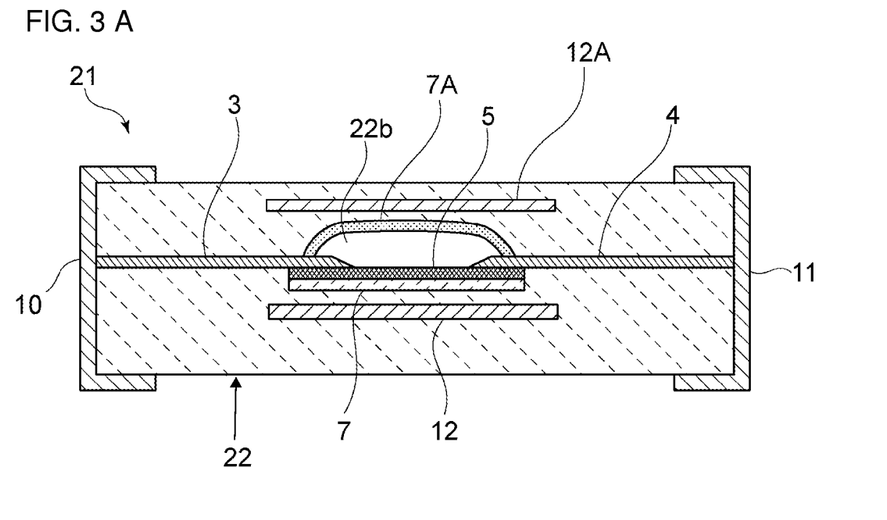
FIGS. 3A and 3B are cross-sectional front views of an ESD protection device according to Embodiment 2 of the present disclosure and a partial cutaway enlarged cross-sectional front view of its main part.
Figure 3B:
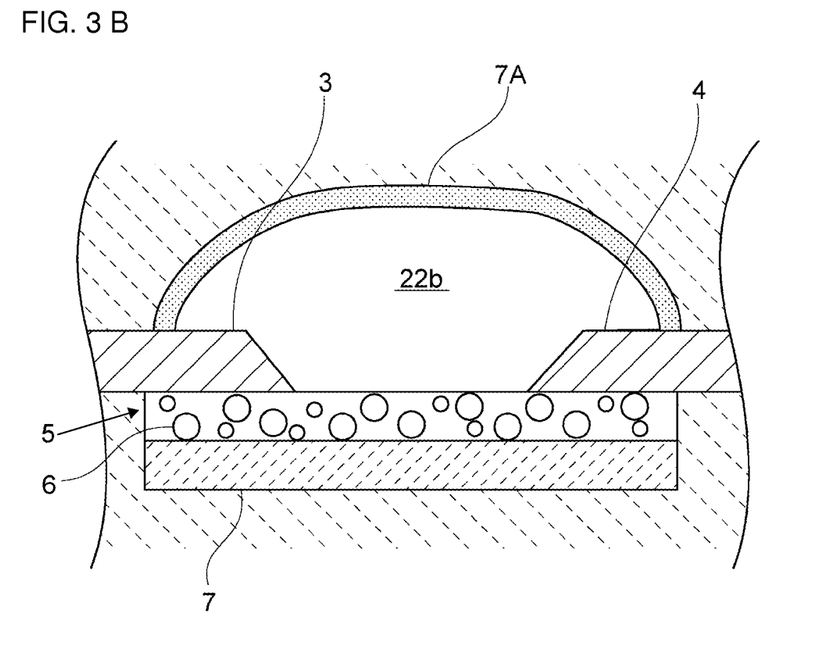

FIGS. 3A and 3B are a cross-sectional front view of an ESD protection device 21 according to Embodiment 2 of the present disclosure and a partial cutaway enlarged cross-sectional front view of its main part.

The ESD protection device 21 according to Embodiment 2 has a substrate 22. The materials of which the substrate 22 can be made are similar to those for the substrate 2 in Embodiment 1.

The substrate 22 contains first and second discharge electrodes 3 and 4. The respective distal ends of the first and second discharge electrodes 3 and 4 face each other with a gap therebetween. There is a discharge-assisting electrode 5 that couples the respective distal ends of the first and second discharge electrodes 3 and 4. The first and second discharge electrodes 3 and 4 and the discharge-assisting electrode 5 are equivalent to the first and second discharge electrodes 3 and 4 and discharge-assisting electrode 5 in Embodiment 1, except for the positions where they are formed. The descriptions in Embodiment 1 therefore apply to them. In this embodiment, however, there is a cavity 22b in the section where the respective distal ends of the first and second discharge electrodes 3 and 4 face each other. The distal ends of the first and second discharge electrodes 3 and 4 are exposed in this cavity 22b. This means that the gap between the distal end of the first discharge electrode 3 and that of the second discharge electrode 4 is located in the cavity 22b. The gap therefore contains the gas filling the cavity 22b. The relative dielectric constant of the gas is, for example, 1.00059 if the gas is air. The section that forms the gap therefore has a relatively low dielectric constant as compared with that of the substrate 2.

This embodiment, in common with Embodiment 1, involves a high-dielectric-constant layer 7 located beneath the discharge-assisting electrode 5. In this embodiment, however, there is another high-dielectric-constant layer 7A above the cavity 22b. The high-dielectric-constant layer 7A is made of the same material as the high-dielectric-constant layer 7. The high-dielectric-constant layer 7A is located on the surface of the substrate 22 that borders the cavity 22b. The high-dielectric-constant layer 7A couples the respective distal ends of the first and second discharge electrodes 3 and 4. Although there need only be at least one of the high-dielectric-constant layers 7 and 7A, both can be present as in this embodiment.

The substrate 22 also contains a back electrode 12 facing the high-dielectric-constant layer 7 and the first and second discharge electrodes 3 and 4 with a substrate layer therebetween. The back electrode 12 is equivalent to the back electrode 12 in Embodiment 1. In this embodiment, there is another back electrode 12A above the cavity 22b. The back electrode 12A is made of a material similar to that for the back electrode 12. The shape and position of the back electrode 12A in plan view are the same as those of the back electrode 12. The back electrode 12A is therefore in the position of the back electrode 12 illustrated in FIG. 4.

The first and second discharge electrodes 3 and 4 are electrically coupled with first and second outer electrodes 10 and 11. The first and second outer electrodes 10 and 11 are equivalent to those in Embodiment 1.

The ESD protection device 21 according to Embodiment 2 discharges through both types of discharges, surface discharge and aerial discharge, in response to the application of static electricity between the first discharge electrode 3 and the second discharge electrode 4. The discharge inception voltage is advantageously low as in Embodiment 1 because of the presence of the discharge-assisting electrode 5 and the high-dielectric-constant layers 7 and 7A near the surfaces of the first and second discharge electrodes 3 and 4. The back electrodes 12 and 12A also contribute to the low discharge inception voltage.

Electrically coupling the back electrodes 12 and 12A with the first outer electrode 10 or the second outer electrode 11 in this embodiment would also lead to even lower discharge inception voltage and less thermal damage.

As is clearly understood from the ESD protection device 21 according to Embodiment 2, it is possible in the present disclosure that the first and second discharge electrodes 3 and 4 are contained in the substrate 22. Creating the cavity 22b would allow the use of aerial discharge in addition to surface discharge. In this embodiment, however, components such as the cavity 22b and the discharge-assisting electrode 5 are optional. For example, the region between the first and second discharge electrodes 3 and 4 may be a porous layer in which a substance such as a voltage-nonlinear material, metal, or semiconductor is dispersed.

Figure 4:
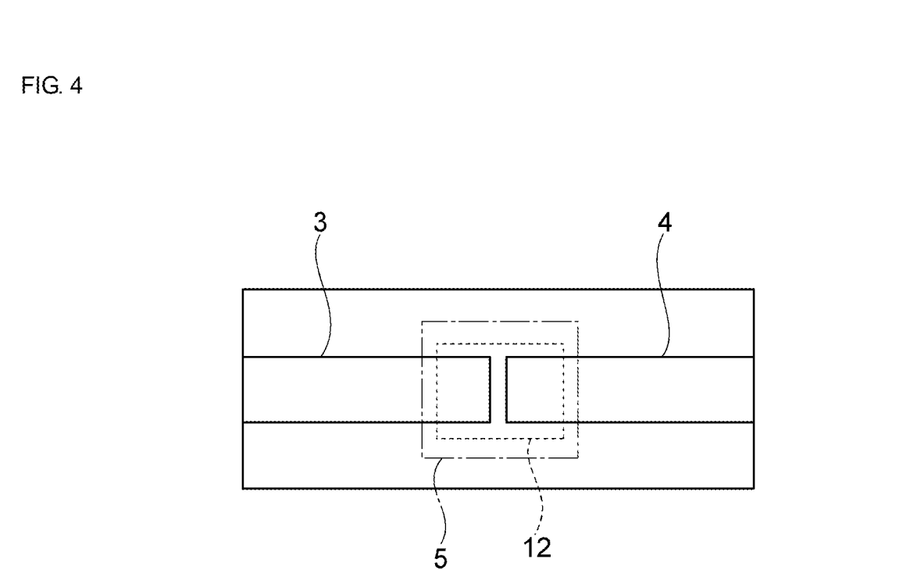
FIG. 4 is a schematic plan view illustrating the relative positions of first and second discharge electrodes, a discharge-assisting electrode, and a back electrode in an ESD protection device according to Embodiment 2 of the present disclosure.
Figure 5:
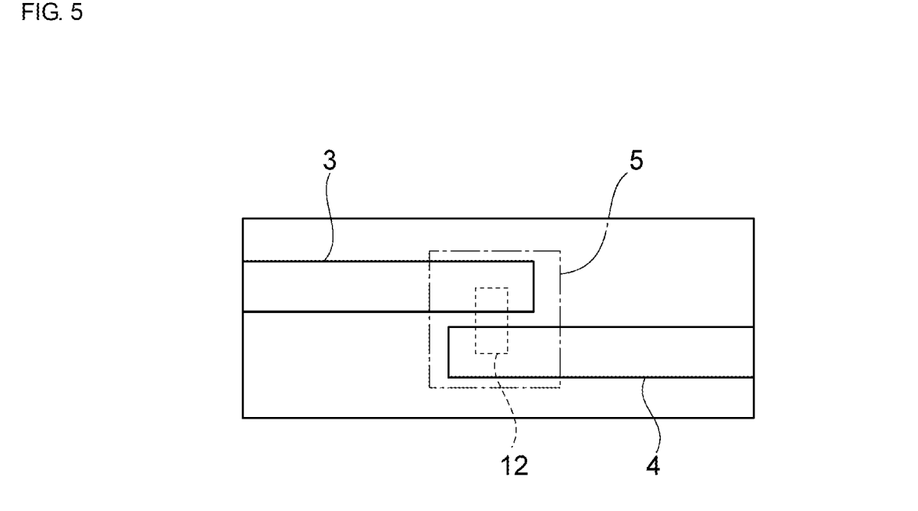
FIG. 5 is a schematic plan view for describing a variation in terms of the relative positions of first and second discharge electrodes, a discharge-assisting electrode, and a back electrode.
Figure 6:
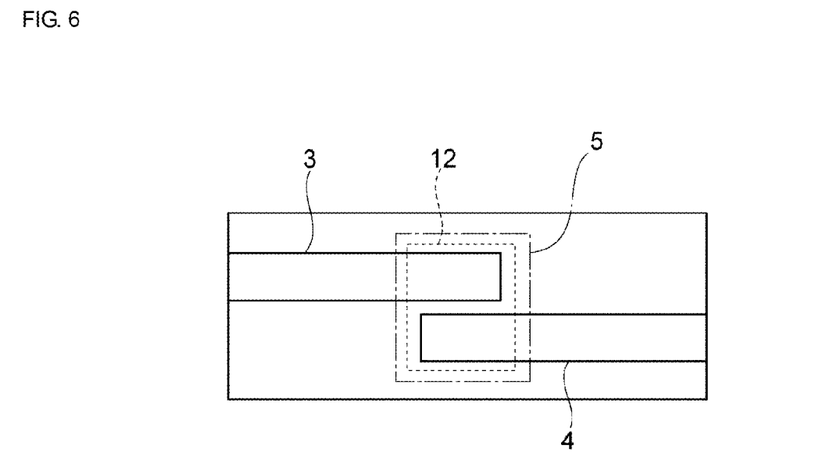
FIG. 6 is a schematic plan view for describing another variation in terms of the relative positions of first and second discharge electrodes, a discharge-assisting electrode, and a back electrode.

In the present disclosure, the relative positions of the first and second discharge electrodes 3 and 4, the discharge-assisting electrode 5, and the back electrode 12 are not limited to those schematically illustrated in FIGS. 2 and 4. To be more specific, the first discharge electrode 3 and the second discharge electrode 4 may be arranged in such a manner that their respective distal sides, rather than distal ends, face each other with a gap therebetween as illustrated in FIG. 5. As in the above case, there are a back electrode 12, a discharge-assisting electrode 5, and a high-dielectric-constant layer 7 in the region where the gap is present. It is also possible that the back electrode 12 extends over the entire gap region as illustrated in FIG. 6.

In FIG. 2, furthermore, the distal end of the first discharge electrode 3 and that of the second discharge electrode 4 face each other with a gap therebetween. The back electrode 12 overlaps with the first and second discharge electrodes 3 and 4 in some part of this gap in plan view. As in this drawing, the dimension of the back electrode 12 in the width direction may be smaller than that of the discharge electrodes 3 and 4. The dimension in the width direction refers to the direction perpendicular to the direction in which the first and second discharge electrodes 3 and 4 face each other.

The discharge-assisting electrode 5 can be in any shape in plan view as long as it couples the first and second discharge electrodes 3 and 4.

Likewise, the high-dielectric-constant layer 7 can be in any shape in plan view as long as it, directly or indirectly, couples the first and second discharge electrodes 3 and 4.

Figure 7:
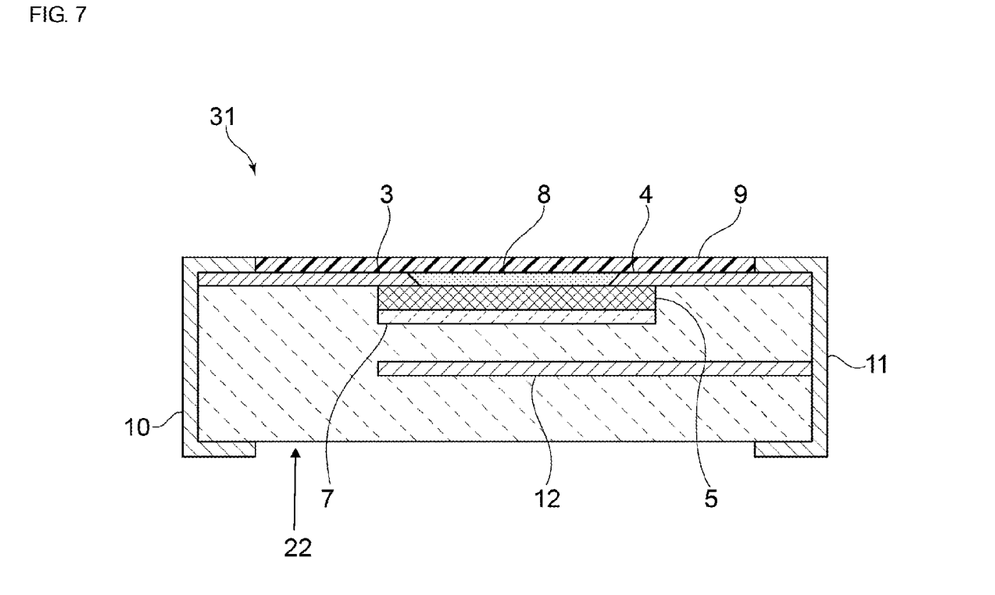
FIG. 7 is a cross-sectional front view of an ESD protection device according to Embodiment 3 of the present disclosure.
Figure 8:
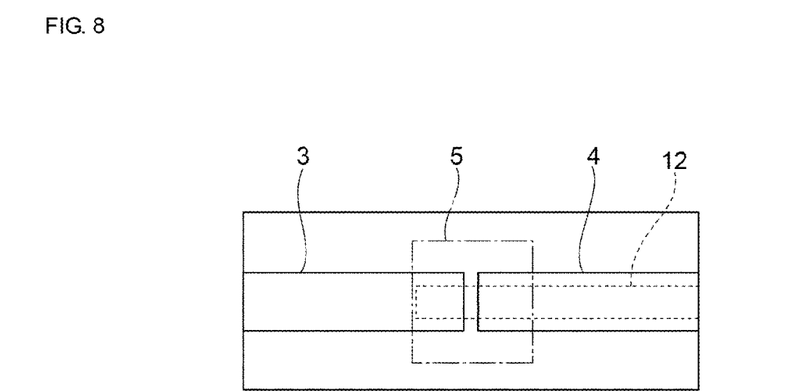
FIG. 8 is a schematic plan view illustrating the relative positions of first and second discharge electrodes, a discharge-assisting electrode, and a back electrode in an ESD protection device according to Embodiment 3 of the present disclosure.

FIG. 7 is a cross-sectional front view of an ESD protection device 31 according to Embodiment 3 of the present disclosure. FIG. 8 is a schematic plan view illustrating the relative positions of first and second discharge electrodes 3 and 4, a discharge-assisting electrode 5, a high-dielectric-constant layer 7, and a back electrode 12 in the ESD protection device 31 according to Embodiment 3. As illustrated in FIGS. 7 and 8, the back electrode 12 in Embodiment 3 extends to a side surface of the substrate 22 and is electrically coupled with a second outer electrode 11. All other features are equivalent to those of the ESD protection device 1 according to Embodiment 1.

Electrically coupling the back electrode 12 with the outer electrode 11 as in this embodiment would lead to even lower discharge inception voltage.

The ESD protection device 31 according to Embodiment 3 is equivalent to the ESD protection device 1 with respect to the structural features other than that mentioned above. Its discharge inception voltage is therefore low like that of the ESD protection device 1, and it is unlikely that its production involves a complicated process.

Figure 9:
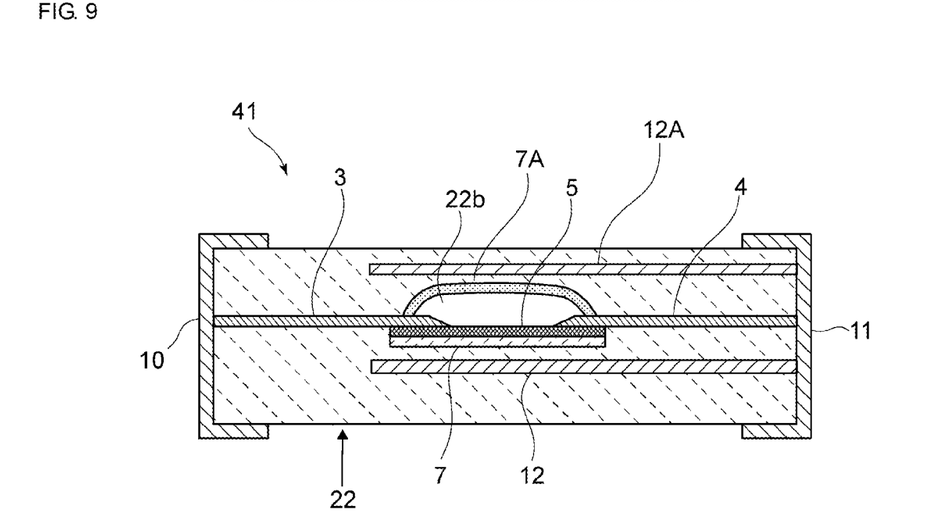
FIG. 9 is a cross-sectional front view of an ESD protection device according to Embodiment 4 of the present disclosure.
Figure 10:
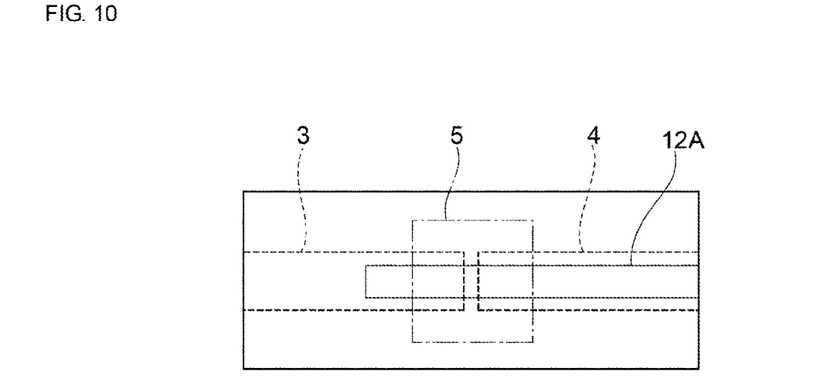
FIG. 10 is a schematic plan view illustrating the relative positions of first and second discharge electrodes, a discharge-assisting electrode, and a back electrode in an ESD protection device according to Embodiment 4 of the present disclosure.

Likewise, FIGS. 9 and 10 are a cross-sectional front view of an ESD protection device 41 according to Embodiment 4 and a schematic plan view illustrating the relative positions of first and second discharge electrodes 3 and 4, a discharge-assisting electrode 5, a high-dielectric-constant layer 7, and a back electrode 12 in this ESD protection device 41.

The ESD protection device 41 according to Embodiment 4 lies in back electrodes 12 and 12A electrically coupled with an outer electrode 11. In all other respects, Embodiment 4 is equivalent to Embodiment 2.

Embodiment 4 also makes the discharge inception voltage even lower because of the back electrodes 12 and 12A electrically coupled with the outer electrode 11. This embodiment also reduces thermal damage.

The ESD protection device 41 according to Embodiment 4 is equivalent to the ESD protection device 21 with respect to the structural features other than that mentioned above. Its discharge inception voltage is therefore low like that of the ESD protection device 21.

Figure 11:
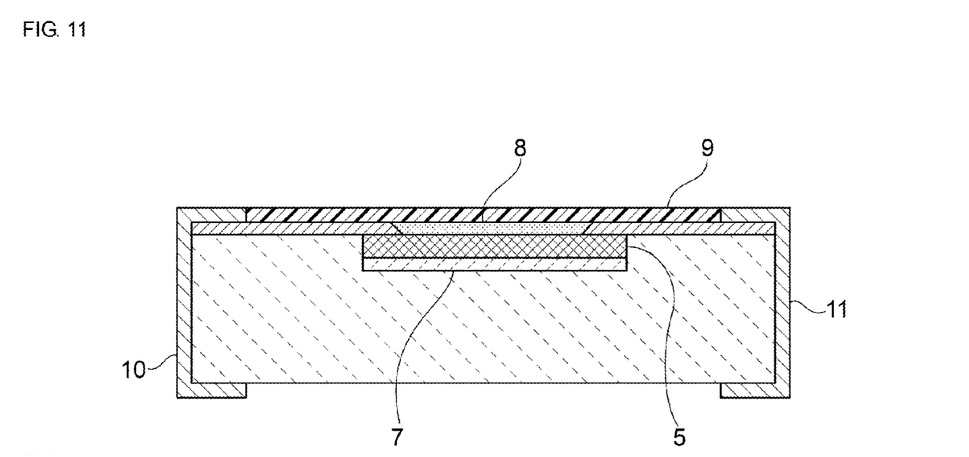
FIG. 11 is a cross-sectional front view of an ESD protection device according to Embodiment 5 of the present disclosure.
Figure 12:
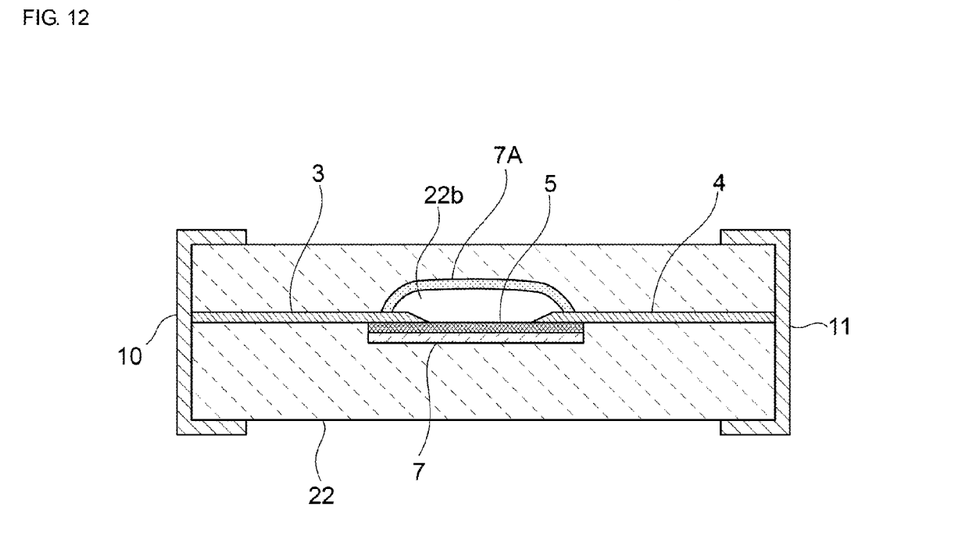
FIG. 12 is a cross-sectional front view of an ESD protection device according to Embodiment 6 of the present disclosure.

Although the ESD protection devices 1 and 21 according to Embodiments 1 and 2 have a back electrode 12 or back electrodes 12 and 12A, the back electrode(s) may be omitted as in Embodiments 5 and 6 illustrated in FIGS. 11 and 12.

Figure 13:
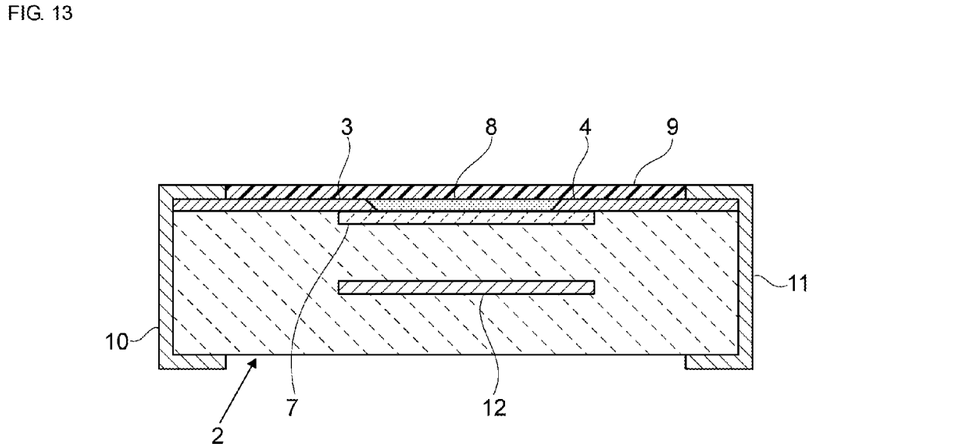
FIG. 13 is a cross-sectional front view of an ESD protection device according to Embodiment 7 of the present disclosure.
Figure 14:
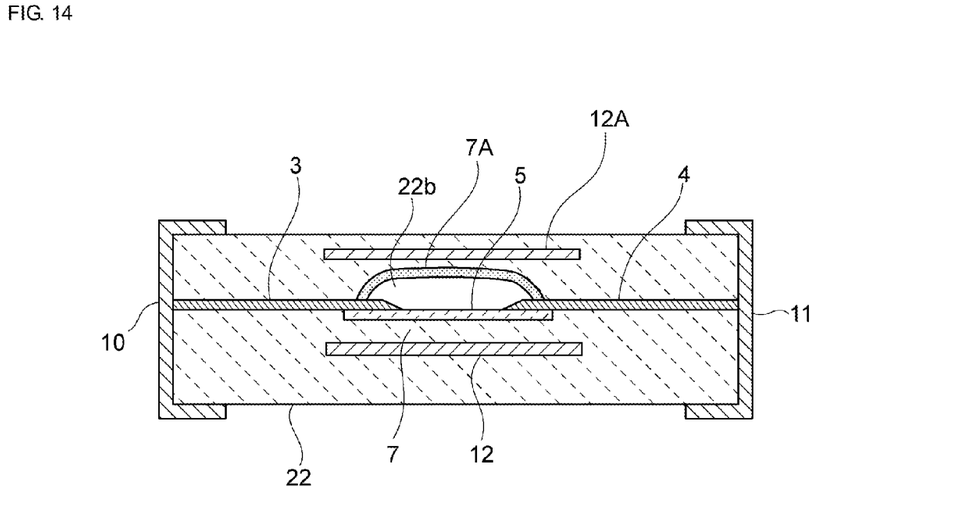
FIG. 14 is a cross-sectional front view of an ESD protection device according to Embodiment 8 of the present disclosure.

Likewise, the discharge-assisting electrode 5 used in Embodiments 1 and 2 may be omitted as in Embodiments 7 and 8 illustrated in FIGS. 13 and 14.

The following describes some specific examples of the present disclosure.

Examples 1 and 2 and Comparative Example 1

ESD protection devices of Examples 1 and 2 as examples of Embodiment 2 and of Comparative Example 1 for comparison were prepared as follows.

A ceramic powder having a ceramic composition based on Ba, Al, and Si, a powder of the material known as BAS, was prepared (a relative dielectric constant of 5 to 9). This ceramic powder was mixed with toluene and EKINEN, and a binder resin and a plasticizer were added to form ceramic slurry. The ceramic slurry was shaped into a 50-μm-thick mother ceramic green sheet using the doctor blade method. The high-dielectric-constant powder in Table 1 below and the oxide powder in Table 2 below were also prepared.

TABLE 1

| High-dielectric-constant powder | Composition | Relative dielectric constant (εr) | D50 (μm) | SSA ($m^2/g$) |
|---|---|---|---|---|
| DM-1 | $BaTiO_3$ | 2000 | 0.5 | 1.7 |

TABLE 2

| Oxide powder | Composition | D10 (μm) | D50 (μm) | D90 (μm) | SSA ($m^2/g$) |
|---|---|---|---|---|---|
| O-1 | $Al_2O_3$ | 0.15 | 0.35 | 0.80 | 6.77 |

The average particle diameters D10, D50, and D90 in Tables 1 and 2 were determined using a flow distribution method based on laser diffraction.

The specific surface areas (SSA) in Tables 1 and 2 were determined using the nitrogen BET single-point method.

The high-dielectric-constant powder was obtained through the pulverization of a barium titanate plate having a relative dielectric constant of 2000.

The high-dielectric-constant powder in Table 1 above, the oxide powder in Table 2, and an organic vehicle solution were mixed to form high-dielectric-constant layer paste P-1 with the composition in Table 3 below. For comparison, high-dielectric-constant layer paste P-2, a paste containing no oxide powder, was prepared.

TABLE 3

| | Solids concentration (% by weight) | | |
|---|---|---|---|
| Paste | Oxide powder O-1 | High-dielectric constant powder DM-1 | Organic vehicle solution |
| P-1 | 10 | 10 | 80 |
| P-2 | 0 | 20 | 80 |

(Discharge-Assisting Electrode Paste)

A Cu—Al alloy powder having an average particle diameter of 2.5 μm and an Al content of 7% by weight, a BaO—$Si_2$—$Al_2O_3$ glass ceramic powder having an average particle diameter of 0.5 μm, and an organic vehicle solution containing 10% by weight ETHOCEL polymer in terpineol were prepared. These materials were mixed to make the quantities of the Cu alloy powder and the BaO—$Si_2$—$Al_2O_3$ glass ceramic powder 11.2% by volume and 2.8% by volume, respectively, of the entire mixture with the organic vehicle powder being the balance. A discharge-assisting electrode paste was obtained in this way.

(Paste for Cavity Creation)

Thirty-eight percent by weight cross-linked acrylic polymer beads having an average particle diameter of 1 μm and 62% by weight organic vehicle solution containing 10% by weight ETHOCEL polymer in terpineol were compounded into a paste, yielding a cavity creation paste.

(Outer Electrode Paste)

Eighty percent by weight Cu powder having an average particle diameter of 1 μm, 5% by weight alkali borosilicate glass frit having a glass transition point of 620° C., a softening point of 720° C., and an average particle diameter of 1 μm, and 15% by weight of organic vehicle as a solution of ethyl cellulose in terpineol were mixed, yielding a paste for outer terminal electrodes.

(Discharge Electrode Paste)

A compound of 40% by weight Cu powder having an average particle diameter of 1 μm, 40% by weight of Cu powder having an average particle diameter of 3 μm, and 20% by weight organic vehicle as a solution of ethyl cellulose in terpineol was mixed using a three-roll mill, yielding a paste for discharge electrodes.

(Production of a Ceramic Multilayer Substrate)

The high-dielectric-constant layer paste was applied to the mother ceramic green sheet. The assisting electrode paste was applied to the resulting coating. The discharge electrode paste was then applied to the areas where first and second discharge electrodes were to be formed. The distance of the interposed gap was set to be 20 μm. The cavity creation paste was then applied, and a high-dielectric-constant layer was applied to the top of the cavity and dried.

A stack of multiple mother ceramic green sheets was pressure-bonded to the top and bottom of this mother ceramic green sheet carrying a coating of the cavity creation paste, yielding a 0.3-mm-thick mother multilayer body.

To provide substrates for separate ESD protection devices, this mother multilayer body was cut in the thickness direction into chips having a shape of 1.0 mm×0.5 mm in plan view.

The Cu—Al alloy powder in the discharge-assisting electrode paste turns into a form composed of Cu in the middle and an insulating layer of $Al_2O_3$, an oxidized form of Al, on the outer surface upon being fired. In the discharge-assisting electrode, therefore, metallic particles coated with a non-conductive material will be dispersed.

After firing, furthermore, a barium titanate layer as a high-dielectric-constant layer will be left near the surfaces of the discharge electrodes.

Substrates were obtained through the production of chips in this way. The outer electrode paste was applied to both end faces of these substrates and fired to form outer electrodes. Ni plating and Sn plating layers were then formed on the surface of the outer electrodes using electroplating. ESD protection devices were obtained in this way.

There were obtained ESD protection devices of Example 1 obtained in the way described above and ESD protection devices of Example 2 obtained in the same way as in Example 1 above except that high-dielectric-constant layer paste P-2 was used. Furthermore, there were obtained ESD protection devices of Example 1 obtained in the way described above and ESD protection devices of Comparative Example 1 obtained in the same way in Example 1 above except that no high-dielectric-constant layer paste was used.

The ESD protection devices obtained in this way were subjected to ESD through contact discharge in accordance with IEC 61000-4-2, an IEC standard, starting with the lowest voltage level. The percentage normal operation was determined at each level of voltage applied. To be more specific, the proportion of samples that initiated discharge to a total of 100 samples was determined and used as the percentage normal operation. The following symbols were used to evaluate the percentage normal operation.

⊙ . . . More than 90% to 100%

○ . . . More than 50% to 90%

Δ . . . More than 10% to 50%

× . . . 0% to 10%

The results are summarized in Table 4 below.

TABLE 4

|  | Percentage normal operation (%) | | | |
| --- | --- | --- | --- | --- |
|  | 2 kV | 3 kV | 4 kV | 5 kV |
| Comparative Example 1 | X | X | ○ | ⊙ |
| Example 1 | X | X | ⊙ | ⊙ |
| Example 2 | X | Δ | ⊙ | ⊙ |

As is clear from Table 4, the percentage normal operation was high, i.e., the discharge inception voltage was advantageously low, in Example 1 as compared with Comparative Example 1. The results also indicate that in Example 2, which contained no oxide powder, the discharge inception voltage was more advantageously low.

The electrostatic capacity was measured using an Agilent LCR meter under Vbias=0 V and 1 MHz conditions. The results are summarized in Table 5 below.

TABLE 5

|  | Electrostatic capacity (pF) |
| --- | --- |
| Comparative Example 1 | 0.05 |
| Example 1 | 0.06 |
| Example 2 | 0.07 |

As is clear from Table 5, the electrostatic capacity was high in Examples 1 and 2 as compared with Comparative Example 1. This suggests that the charge effects caused by increased electrostatic capacity made the discharge inception voltage even lower. In general, ESD protection devices for high-frequency circuits usually have an electrostatic capacity of 0.5 pF or more. The ESD protection devices of Examples 1 and 2 are therefore well fit for use with high-frequency circuits.

Examples 3 and 4

An electrode paste having the same composition as the discharge electrode paste used in Example 2 was prepared as back electrode paste.

The back electrode paste was applied to a mother ceramic green sheet using screen printing in such a manner that it would be isolated from outer electrodes. ESD protection devices of Example 3 were obtained in the same way as in Example 1, except that this mother ceramic green sheet carrying the back electrode paste was inserted.

ESD protection devices of Example 4 were then obtained in the same way as in Example 1, except that the back electrode was applied in such a manner that it would finally be coupled with an outer electrode.

In Examples 3 and 4, the back electrode was located 10 μm lower than the positions where the first and second discharge electrodes 3 and 4 would be in the mother multilayer body.

The percentage normal operation of the ESD protection devices of Examples 3 and 4 obtained in this way was evaluated in the same way as in Example 2.

The results are summarized in Table 6 below.

TABLE 6

|  | Percentage normal operation (%) | | | |
| --- | --- | --- | --- | --- |
|  | 2 kV | 3 kV | 4 kV | 5 kV |
| Example 3 | X | ○ | ⊙ | ⊙ |
| Example 4 | Δ | ○ | ⊙ | ⊙ |

As is clear from Table 6, the discharge inception voltage can be even lower in Examples 3 and 4 than in Example 2. The results therefore indicate that the use of a back electrode can make the discharge inception voltage even lower.

The electrostatic capacity was then measured in the same way as in Example 2. The results are summarized in Table 7 below.

TABLE 7

|  | Electrostatic capacity (pF) |
| --- | --- |
| Example 3 | 0.08 |
| Example 4 | 0.15 |

The electrostatic capacity was also even higher in Examples 3 and 4 than in Example 2. It appears that the accordingly enhanced charge effects made the discharge inception voltage even lower. The ESD protection devices of Examples 3 and 4 were also found to be fit for use with high-frequency circuits as their electrostatic capacity was smaller than 0.5 pF.

REFERENCE SIGNS LIST

1 . . . ESD protection device
2 . . . Substrate
2a . . . Top surface
3, 4 . . . First and second discharge electrodes
5 . . . Discharge-assisting electrode
6 . . . Conductive particles coated with a nonconductive material
7, 7A . . . High-dielectric-constant layer
8, 9 . . . Plastic (resin) layers
10, 11 . . . First and second outer electrodes
12, 12A . . . Back electrode
21, 31, 41 . . . ESD protection device
22 . . . Substrate
22b . . . Cavity

The invention claimed is:

1. An ESD protection device comprising:
a substrate;
first and second discharge electrodes provided on the substrate, the first and second discharge electrodes facing each other with a gap therebetween;
a high-dielectric-constant layer, directly or indirectly, coupling the first discharge electrode and the second discharge electrode, the high-dielectric-constant layer having a relative dielectric constant of 30 or more; and
a back electrode overlapping with the gap between the first and second discharge electrodes with part of the substrate therebetween.

2. The ESD protection device according to claim 1, further comprising a discharge-assisting electrode for promoting discharge between the first and second discharge electrodes, the discharge-assisting electrode coupling the first discharge electrode and the second discharge electrode.

3. The ESD protection device according to claim 2, wherein the discharge-assisting electrode contains conductive particles coated with a nonconductive material.

4. The ESD protection device according to claim 2, wherein the high-dielectric-constant layer is on the discharge-assisting electrode.

5. The ESD protection device according to claim 1, wherein the high-dielectric-constant layer extends at least above or beneath the gap.

6. The ESD protection device according to claim 1, wherein the gap comprises a section having a relative dielectric constant lower than that of the substrate.

7. The ESD protection device according to claim 6, wherein the section having the relative dielectric constant lower than that of the substrate is a cavity.

8. The ESD protection device according to claim 6, wherein the section having the relative dielectric constant lower than that of the substrate is made of a material having a relative dielectric constant lower than that of the substrate.

9. The ESD protection device according to claim 8, wherein the material having a relative dielectric constant lower than that of the substrate is a resin.

10. The ESD protection device according to claim 1, further comprising first and second outer electrodes located on the substrate and electrically coupled with the first and second discharge electrodes, respectively, wherein
the back electrode is electrically coupled with one of the first and second discharge electrodes.

11. The ESD protection device according to claim 1, wherein the back electrode is a floating electrode.

12. The ESD protection device according to claim 1, wherein the back electrode contains a metal and a material having a dielectric constant higher than that of the substrate.

13. The ESD protection device according to claim 1, wherein the first and second discharge electrodes are located on an outer surface of the substrate.

14. The ESD protection device according to claim 1, wherein respective distal ends of the first and second discharge electrodes are disposed in the substrate, and the gap is disposed in the substrate.

* * * * *